United States Patent [19]
Trimberger et al.

[11] Patent Number: 5,642,058
[45] Date of Patent: Jun. 24, 1997

[54] PERIPHERY INPUT/OUTPUT INTERCONNECT STRUCTURE

[75] Inventors: Stephen M. Trimberger; Khue Duong, both of San Jose, Calif.

[73] Assignee: Xilinx, Inc., San Jose, Calif.

[21] Appl. No.: 543,534

[22] Filed: Oct. 16, 1995

[51] Int. Cl.⁶ .................................................. H03K 19/177
[52] U.S. Cl. ............................................. 326/41; 326/101
[58] Field of Search ................................. 326/38–45, 101

[56] References Cited

U.S. PATENT DOCUMENTS

| | | | |
|---|---|---|---|
| 4,722,811 | 2/1988 | Fujioka | 326/41 |
| 4,870,302 | 9/1989 | Freeman | 326/41 |
| 5,023,606 | 6/1991 | Kaplinsky | 326/41 |
| 5,384,497 | 1/1995 | Britton | 326/44 |
| 5,394,033 | 2/1995 | Tsui | 326/41 |
| 5,424,589 | 6/1995 | Dobbelaere | 326/41 |

OTHER PUBLICATIONS

Babb, Jonathan; Tessier, Russell; and Agarwal, Anant, "Virtual Wires: Overcoming Pin Limitations in FPGA-based Logic Emulators", IEEE Workshop on FPGAs for Custom Computing Machines, FCCM 93, Apr. 5–7, 1993 pp. 1–15.

*Primary Examiner*—Edward P. Westin
*Assistant Examiner*—Benjamin D. Driscoll
*Attorney, Agent, or Firm*—Wagner, Murabito & Hao; Jeanette S. Harms

[57] ABSTRACT

A mechanism is provided for allowing input/output signal routing along the periphery of a programmable integrated circuit (IC) so that uniform circuit usage across the programmable integrated circuit is allowed in conjunction with predetermined pin assignments. The mechanism includes a plurality of periphery interconnect lines that run along the periphery of a programmable IC. Input/output blocks (IOBs) that are similarly along the periphery of the programmable IC and configurable logic blocks (CLBs) are coupled to the plurality of periphery interconnect lines using a programmable local interconnect structure. Each IOB includes an associated pad and an input/output external pin. Individual segments of the plurality of periphery interconnect lines utilize a bi-directional buffer to buffer a line of the periphery interconnect. Uniform buffered segments of the periphery interconnect are disposed such that for an interconnect of n lines, each line of the periphery interconnect is buffered at least once every n segments. In operation, a CLB located away from the periphery of the IC can output a signal over the local interconnect, onto the plurality of periphery interconnect lines, onto another local interconnect, into an IOB and over its external pin. To input a signal, the path is reversed. The pin and the CLB do not need to be adjacent.

21 Claims, 11 Drawing Sheets

PERIPHERY INPUT/OUTPUT INTERCONNECT STRUCTURE

BACKGROUND OF THE INVENTION

1. Field of the Invention

The field of the invention relates to interconnect structures for input and output signals of an integrated circuit. More specifically, the present invention relates to the interconnect structure for programmable logic devices.

2. Background Technology

Integrated circuits (ICs), and specifically programmable ICs such as field programmable gate arrays (FPGAs), contain a number of input and output signal pads. When packaged, these pads are coupled through leads to external pins that are used to connect the IC to a larger system or "board" that contains other ICs. When packaged with pins, the IC is often called a "chip" or IC chip.

A system designer conventionally develops a particular board layout giving particular assignments for both the chips of the board and for the signal lines that run between the chips. Therefore, based on the particular socket or area on the board where a chip is to sit, a designer predetermines which input/output signals are to be assigned to which input/output pins of the chip. This pin assignment is often performed before the chip is designed or before the design is laid-out in the IC. Once assigned, a pin is said to be "locked" from use by other signals. As discussed below, IC pin "lock" can cause severe problems for a circuit designer in terms of circuit layout.

FIG. 1 illustrates a typical FPGA 50 including a number of configurable logic blocks (CLBs) 20 that are coupled to a programmable interconnect structure (not shown). As is well known, the interconnect structure allows input/output lines of CLBs 20 to be programmably coupled together. CLBs 20, also well known, can be programmed to perform a number of different logic functions.

FPGA 50 also contains a number of input/output blocks (IOBs) 32 that are used by the IC as an interface between external pins 12 and CLBs 20. IOBs 32 are similarly coupled to the programmable interconnect structure. Although CLBs 20 are coupled together using the programmable interconnect structure, each IOB 32 is directly coupled to an individual pad 10 and an individual external pin 12. For example, IOB 32a of FIG. 1 is directly coupled to pad 10a having an external pin 12a.

As discussed above, when FPGA 50 is to be programmed, its pin assignments can be predetermined, i.e. certain signals are assigned to individual pins. However, when the circuit design to be programmed on FPGA 50 is being designed, it may be more efficient to place certain logic within one or more CLBs that are not spatially near the pin and associated IOB that are to output the signal generated by the logic. For instance, it may be more efficient or a better use of resources to have CLB 20a generate a signal that distant pin 12c needs even though these elements are not near each other. Alternatively, it may be more efficient or easier to place certain logic within one or more CLBs that are not spatially near the pin and associated IOB that input the signal needed by the certain logic. However, by placing the logic far away from its associated pin, a routing problem exists in supplying the signals from the logic to the pin.

A chip layout problem occurs as a result of the predetermined pin assignments done by system designers. Specifically, circuit layout designers feel constrained or forced to fit a large amount of circuitry into the area of FPGA 50 that is near the assigned pins. This design method is problematic because not all of the logic associated with a particular input or output pin can easily be placed adjacent to the pin. In some cases, there are not enough routing resources within the constrained IC area. Therefore, signal routing becomes a problem as the circuitry is spread out. In some instances, circuit design and functionality become reduced to fit in the constrained area. In other instances, the crowded circuits fit near the pins, but there is little room for additional circuits or expansion, thereby causing signal delays and/or signal errors because of indirect or complex signal routing.

In either of the above cases, it is more advantageous to uniformly utilize the resources of FPGA 50 that are distributed throughout the FPGA's area. Therefore, a need arises for a mechanism that allows system designers to evenly spread logic throughout FPGA 50 device even though the pins of FPGA 50 device are preassigned ("locked"). The present invention allows such advantageous functionality.

SUMMARY OF THE INVENTION

A structure is disclosed for allowing input/output signal routing along the periphery of a programmable integrated circuit (IC) so that uniform circuit usage across the programmable integrated circuit is allowed irrespective of predetermined pin assignments. A structure in accordance with the present invention includes a plurality of periphery interconnect lines that run along the periphery of a programmable IC. Input/output blocks (IOBs) that are similarly disposed along the periphery of the programmable IC and configurable logic blocks (CLBs) are coupled to the plurality of periphery interconnect lines using a programmable local interconnect structure. Each IOB includes an associated pad and an input/output external pin. Individual segments of the plurality of periphery interconnect lines utilize a programmable bi-directional buffer to buffer a line of the periphery interconnect. The programmable buffer can also be programmed as an open circuit creating individual line segments. Uniform buffered segments of the periphery interconnect are disposed such that for an interconnect of n lines, each line of the periphery interconnect is buffered at least once every n segments. This configuration is maintained even though segments wrap around corners within the IC. In operation, a CLB located away from the periphery of the IC can output a signal over the local interconnect, onto the plurality of periphery interconnect lines, onto another local interconnect, into an IOB and over its external pin. To input a signal, the path is reversed. The pin and the CLB need not be adjacent.

DETAILED DESCRIPTION OF THE INVENTION

The present invention includes a periphery interconnect structure that in one embodiment is composed of interconnected segments that are disposed in a ring or annular shaped geometry within the periphery of a programmable integrated circuit, such as an FPGA. The periphery interconnect structure in one embodiment contains eight signal lines; however, note that the present invention is well suited to use more or less lines in the periphery interconnect structure. The periphery interconnect structure is segmented and each segment adopts a uniform structure to facilitate duplication across the FPGA. The periphery interconnect structure allows distant configurable logic blocks (CLBs) and input/output blocks (IOBs) to programmably interconnect so that CLBs within a variety of different locations in the FPGA can communicate with a number of different IOBs.

The present invention reduces the problems associated with pin-lock by providing a decoupling structure where a CLB associated with a particular IOB does not need to be located adjacent to the IOB within the FPGA. In accordance with the present invention, circuit layout designers are not constrained to placing certain logic in any particular location on the FPGA (e.g., adjacent to the associated IOB) because the associated IOB can be readily reached using the periphery interconnect structure.

Figure 1:
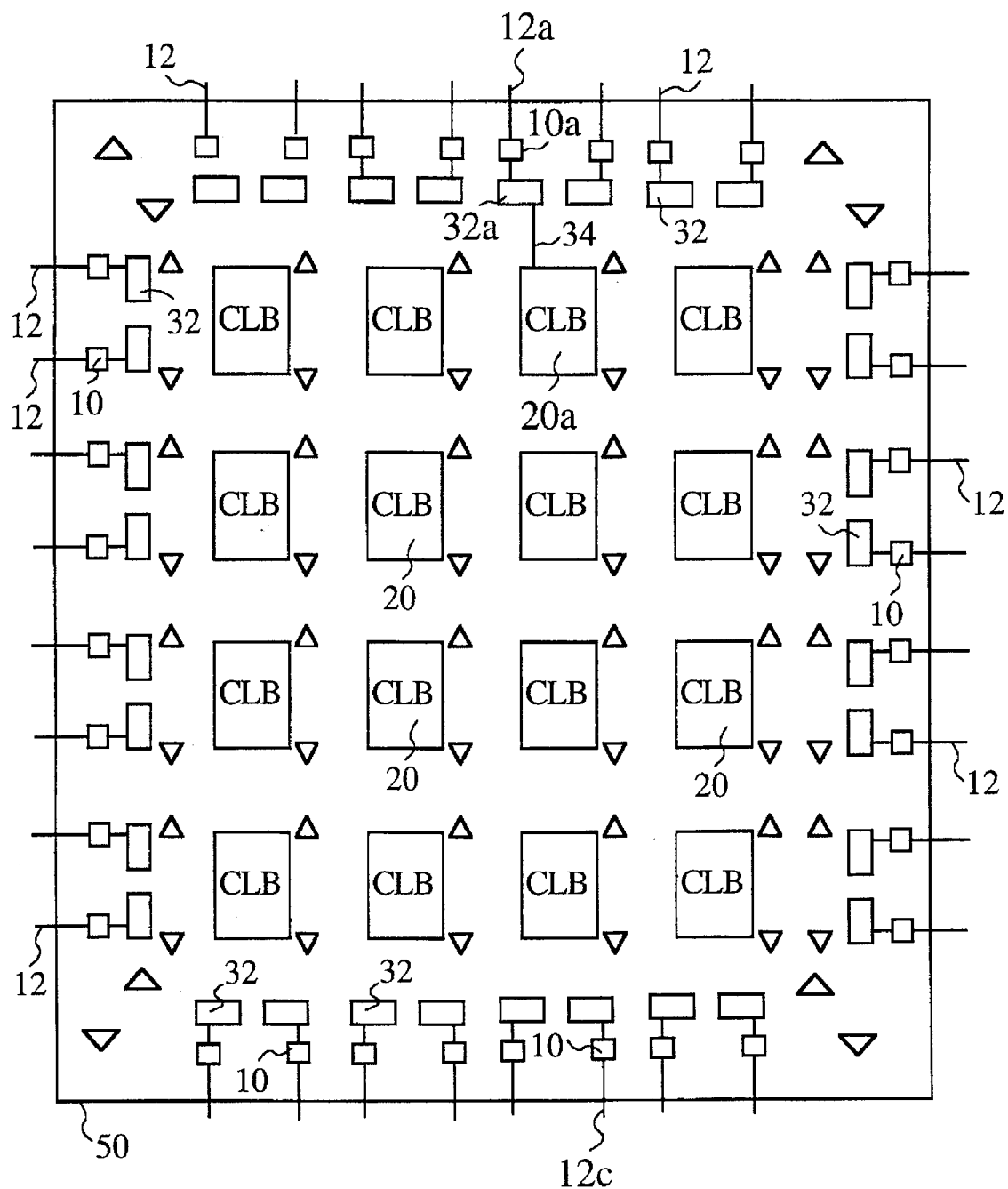
FIG. 1 illustrates a field programmable gate array (FPGA) having a number of internal elements including: configurable logic blocks (CLBs), input/output blocks (IOBs), pads, and pins.
Figure 2:
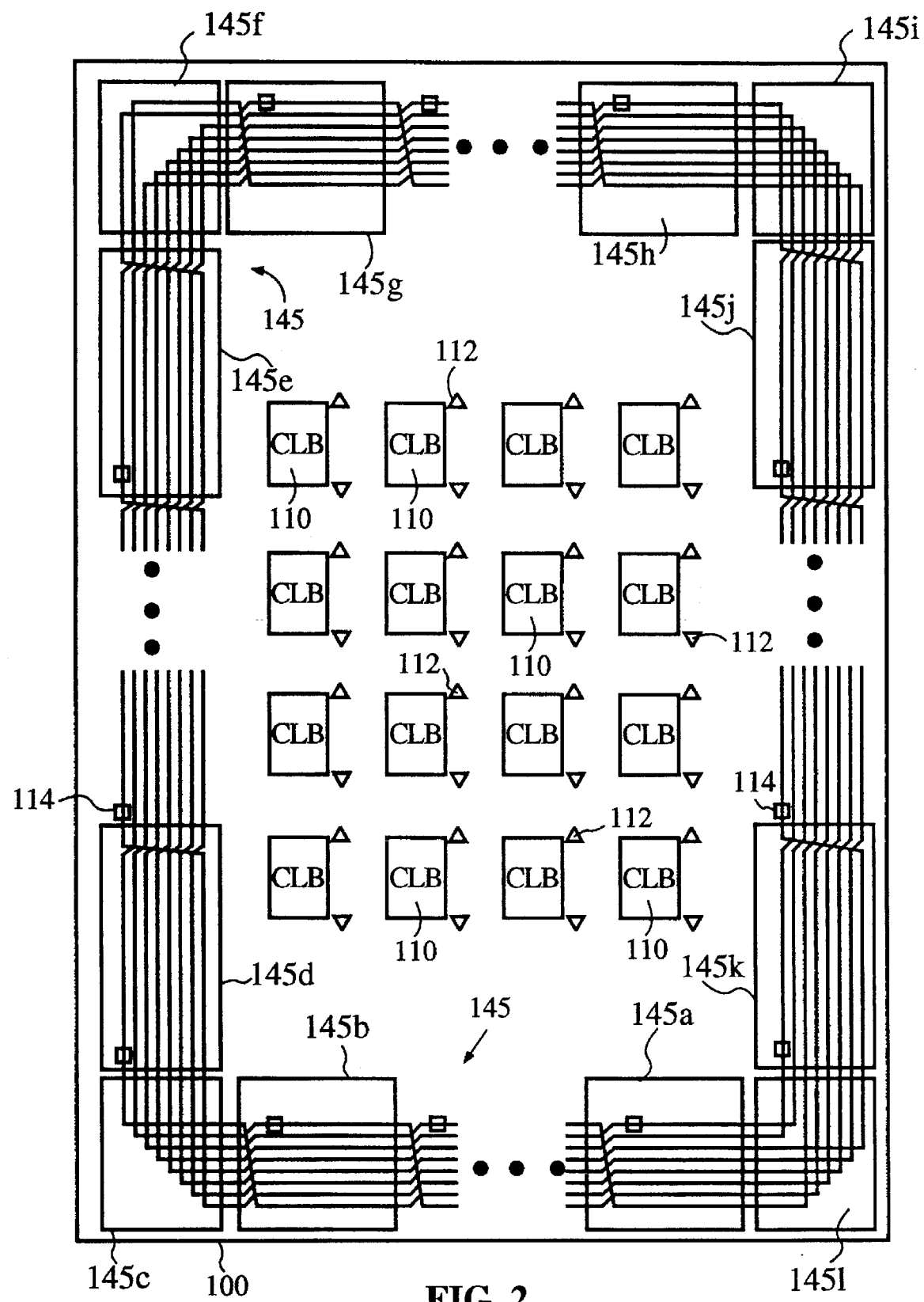
FIG. 2 illustrates a schematic of the present invention periphery interconnect structure in a ring configuration between IOBs within an FPGA.

FIG. 2 illustrates an FPGA 100 which includes an array of CLBs 110. Note that the number of CLBs shown in FIG. 2 is exemplary and the present invention is well suited to accommodate any number CLBs. For example, in one embodiment of the present invention, an array of 36×36 CLBs is used. A programmable local interconnect structure (not shown in FIG. 2) is coupled between CLBs 110 to provide communication between CLBs 110. The programmable local interconnect structure is well known in the art and, therefore, not explained in detail herein. Within the programmable local interconnect structure are drivers (i.e. buffers) 112.

In accordance with the present invention, FPGA 100 further includes a peripheral interconnect structure 145. In one embodiment, structure 145 is ring-shaped and includes corner interconnect segments ("corner segments") 145c, 145f, 145i, 145l and edge interconnect segments ("edge segments") 145a, 145b, 145d, 145e, 145g, 145h, 145j, and 145k. Although not shown in FIG. 2, IOBs are located along the periphery of FPGA 100 adjacent to periphery interconnect structure 145. In one embodiment, two IOBs are located adjacent to each edge segment of periphery interconnect structure 145. The ring geometry of the present invention is particularly useful because the IOBs and the external pins of the IC chip tend to be located in this shape.

Each edge segment is of a uniform construction so that it can readily be duplicated and used throughout the FPGA 100. Each edge segment includes a programmable bi-directional buffer element ("buffer") 114 located in a uniform position within each segment. The programmable buffer element 114, as will be described in more detail below, can be programmed as an open circuit. Although buffer 114 can be located in a variety of different positions within the edge segment, an exemplary placement is shown in FIG. 2. In this example, edge segments that are placed along the left and right edges of FPGA 100 (e.g. edge segments 145d, 145e, 145j, and 145k), locate buffer 114 in the lower left side. This is true whether or not the interconnect segment is located on the right or left edge.

In this example, the interconnect segments that are placed along the top and bottom edges of FPGA 100, e.g. edge segments 145a, 145b, 145g, and 145h, include buffer 114 in the upper left side. Again, this is true whether or not the interconnect segment is located on the top or bottom edge. In this fashion, FIG. 2 illustrates that the edge segments of the peripheral interconnect structure 145 are uniformly disposed and oriented within FPGA 100 irrespective if the segment is positioned on the top or bottom edge or along the left or right edge. This uniformity facilitates duplication during fabrication.

As will be described in more detail below, the group of signal lines that extends through the segments have a particular pattern where the signal line on one end of the group traverses the other seven lines in a first direction to relocate at the other end of the group. Each of the other lines traverses in a second direction, opposite the first direction, by one line. By adopting this particular pattern and uniformly placing buffer 114 at the same location within each edge segment, the segments, when coupled together, insure that each line of the group of lines will be buffered at least once every eight consecutive segments. This particular pattern is advantageous because each line in a segment having n lines in a group will be buffered at least once for every n consecutive edge segments through which the line passes.

Because lines of periphery ring structure 145 are used for carrying signals between two points within FPGA 100, a signal may be provided to structure 145 at one location and exit at any location. In other words, it is not required that the signals traverse a full "lap" of structure 145. In fact, in one embodiment, buffers 114 are programmed to be open circuits, thereby allowing line segmentation within periphery ring structure 145. This line segmentation allows multiple point to point coupling along interconnect structure 145.

Figure 3:
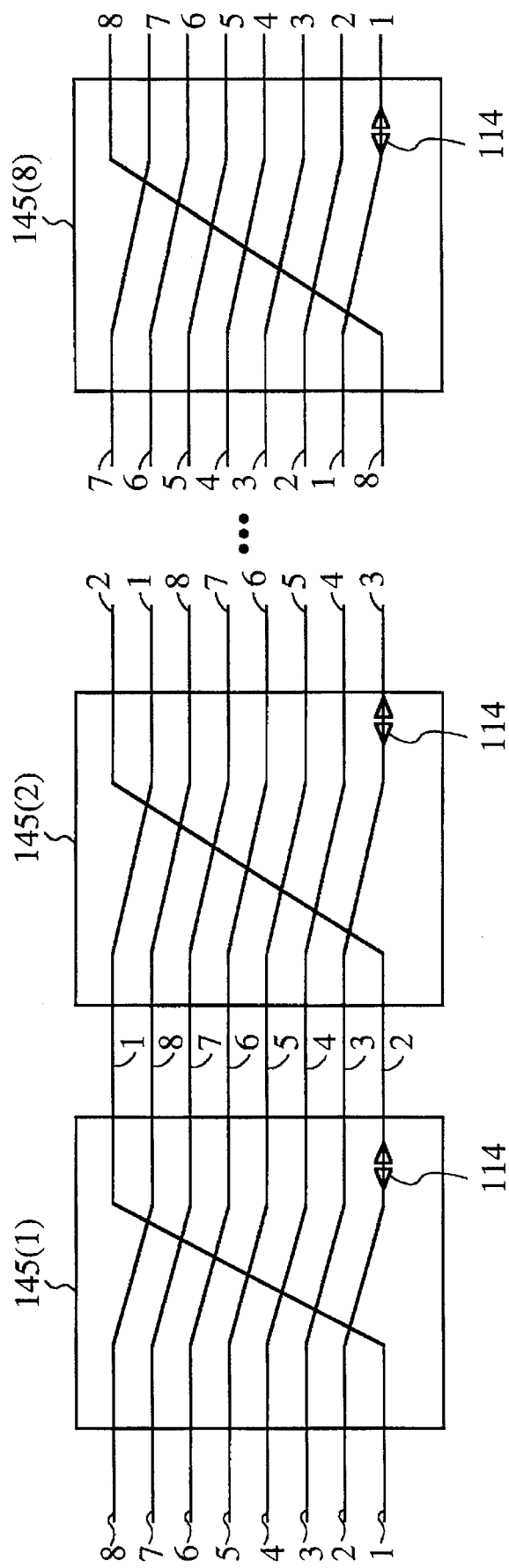
FIG. 3 illustrates a leg of a ring configured periphery interconnect structure of the present invention with n buffered stages for n signal lines.

FIG. 3 illustrates a portion or leg of the peripheral interconnect structure containing eight edge segments 145 (1)–145(8). Only the segments 145(1), 145(2), and 145(8) are shown for clarity. In this example, programmable bi-directional buffer 114 is located along the bottom right of each segment (on line 2 in segment 145(1), on line 3 in segment 145(2), and on line 1 in segment 145(8)). Eight lines enter edge segment 145(1), wherein lines 2–8 traverse down one line each and line 1 traverses seven lines up. This traversing in the structure is called a "shifting configuration." Eight lines enter segment 145(2) and lines 3–8 and 1 each traverse down one line and line 2 traverses seven lines up. This pattern continues through edge blocks 145(3)–145

(7). Finally, eight lines enter edge segment 145(8) and lines 1–7 each traverse down by one line and line 8 traverses up by 7 lines. In this arrangement, each of the signal lines of the group are physically shifted down by one position with the outside signal line physically wrapping around to the opposite side of the segment. By fully traversing segments 145(1)–145(8), each line of lines 1–8 is buffered by a buffer 114 at least once. This advantageous result is reached using a uniform segment having a uniform shifting configuration and a uniformly placed buffer 114. Note that within the present invention buffer 114 can be placed along any line of the group within a particular segment as long as the segment is uniformly duplicated (e.g., buffer 114 holds a uniform position).

Figure 4:
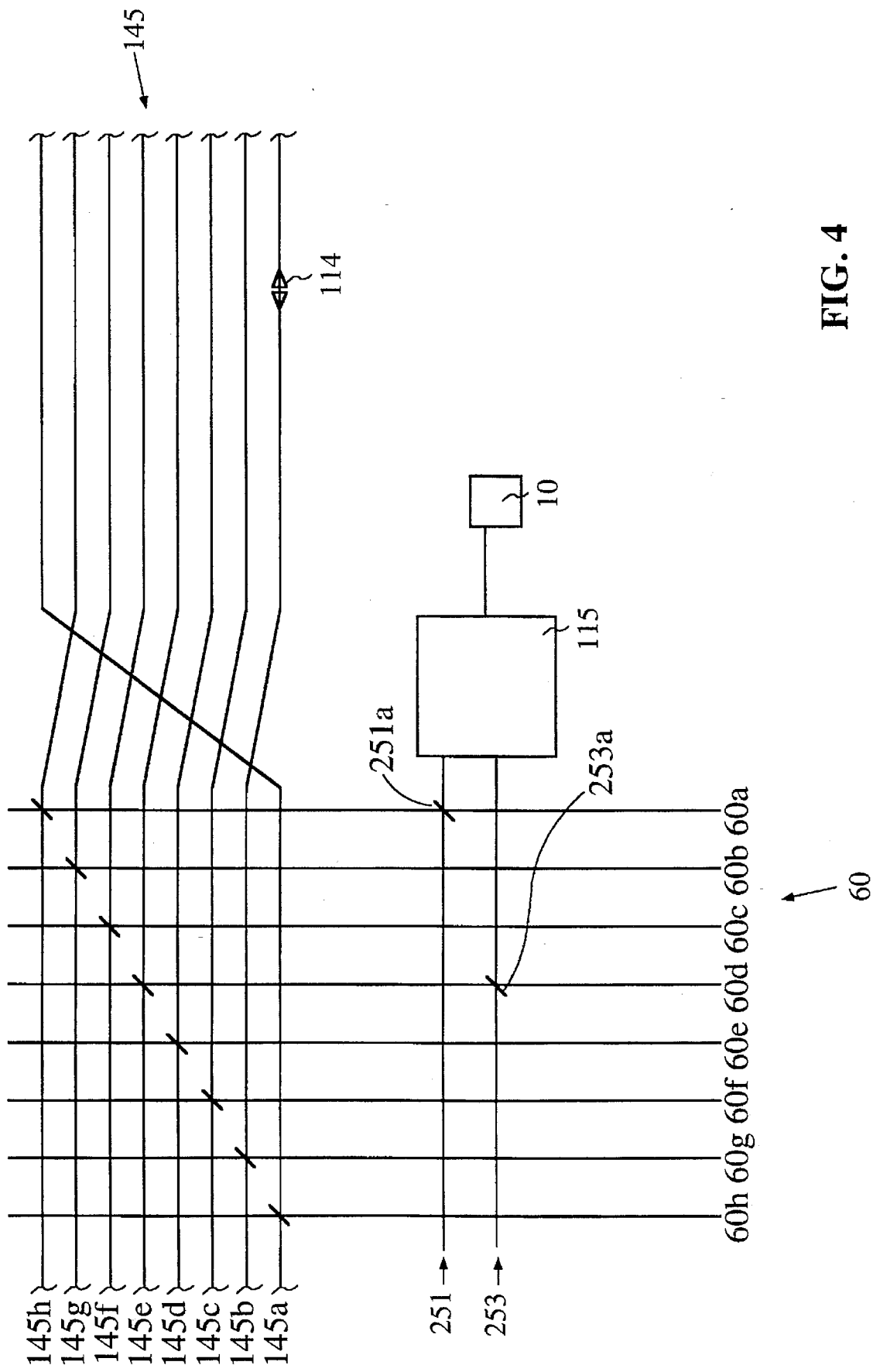
FIG. 4 is a logical schematic of a connection between an IOB and a segment of the periphery interconnect structure of the present invention.

FIG. 4 illustrates the connection of an IOB 115, which includes a number of input and output lines of which exemplary lines 251 and 253 are shown, to an exemplary edge segment of periphery interconnect structure 145 of the present invention. This connection is facilitated by a local interconnect structure 60. Although local interconnect structure 60 can contain different numbers of lines, an exemplary interconnect is shown in FIG. 4 having eight lines 60a–60h. In accordance with one embodiment, lines 251 and 253 of IOB 115 are programmably coupled to lines 60a and 60d of local interconnect structure 60 via programmable interconnect points (PIPs) 251a and 253a. Each of these PIPs, as is well known in the art, includes a pass transistor coupling the two lines of the intersection and also includes a programmable memory cell that controls the gate of the pass transistor. In this manner, a PIP allows a programmable interconnection between the intersecting lines. The memory cell can be of a number of different memory types, including SRAM, DRAM, ROM, FLASH, etc., or can be fabricated from antifuse material.

As shown in FIG. 4, IOB 115 can utilize at least two of the local interconnection lines, 60a and 60d. Although a variety of interconnections are considered within the scope of the present invention, an exemplary interconnection structure is shown in FIG. 4 wherein each line 60a–60h of local interconnect structure 60 is progressively coupled to at least one line of the periphery interconnect structure lines 145a–145h. In this embodiment, a single PIP is placed at the intersection of the following lines: 60a and 145h; 60b and 145g; 60c and 145f; 60d and 145e; 60e and 145d; 60f and 145c; 60g and 145b; and 60h and 145a. Using the above-described programmable connections, IOB 115 can be coupled to at two lines of the periphery interconnect structure 145 of the present invention (i.e. lines 145(h) and 145(e)) using the local interconnect structure 60.

Although only two periphery interconnect lines (e.g., 145h and 145e) are programmably coupled to IOB 115, because the lines of periphery interconnect structure 145 shift one position for each CLB position, different connections are available to adjacent IOBs. Specifically, in accordance with the present invention, IOBs 115 can be programmably coupled to any line of local interconnect structure 60 or any line of periphery interconnect structure 145. Note that IOB 115 is coupled to a pad 10.

Figure 5:
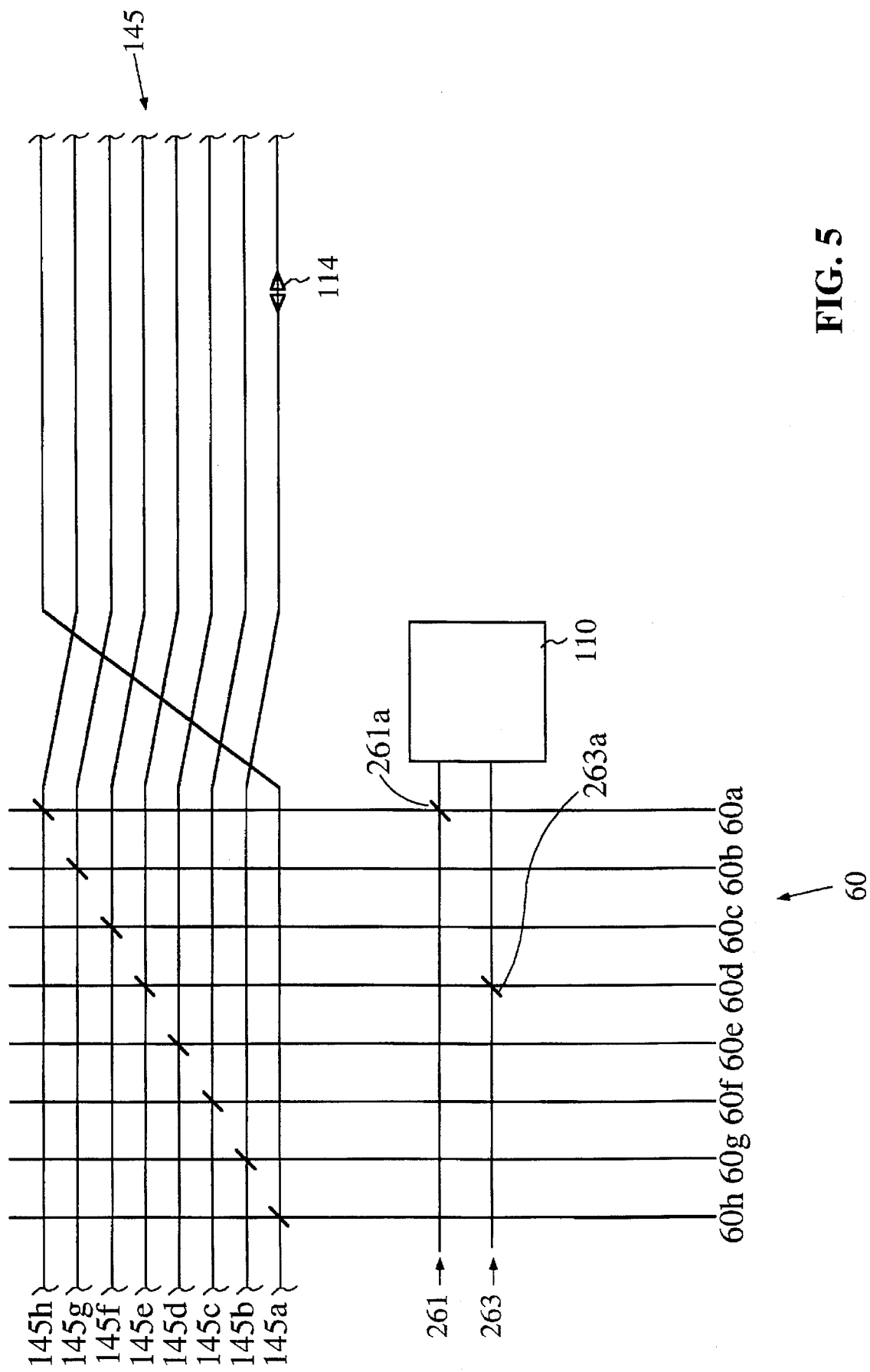
FIG. 5 is a logical schematic of a connection between a CLB and a segment of the periphery interconnect structure of the present invention.

FIG. 5 similarly illustrates a CLB 110 programmably coupled to a segment of periphery interconnect structure 145 of the present invention using local interconnect structure 60. Similar to the connection structure of IOB 115 in FIG. 4, CLB 110 contains a number of input and output signals of which only exemplary signal lines 261 and 263 are shown. These signal lines are programmably coupled to two lines of local interconnect structure 60 using PIPs 261a and 263a. Because local interconnect structure 60 is disposed throughout FPGA 100, a large number of CLBs 110 are IOBs 115 within FPGA 100 have direct access to local interconnect structure 60 and, therefore, have direct access to multiple points of periphery interconnect structure 145 of the present invention.

Figure 6:
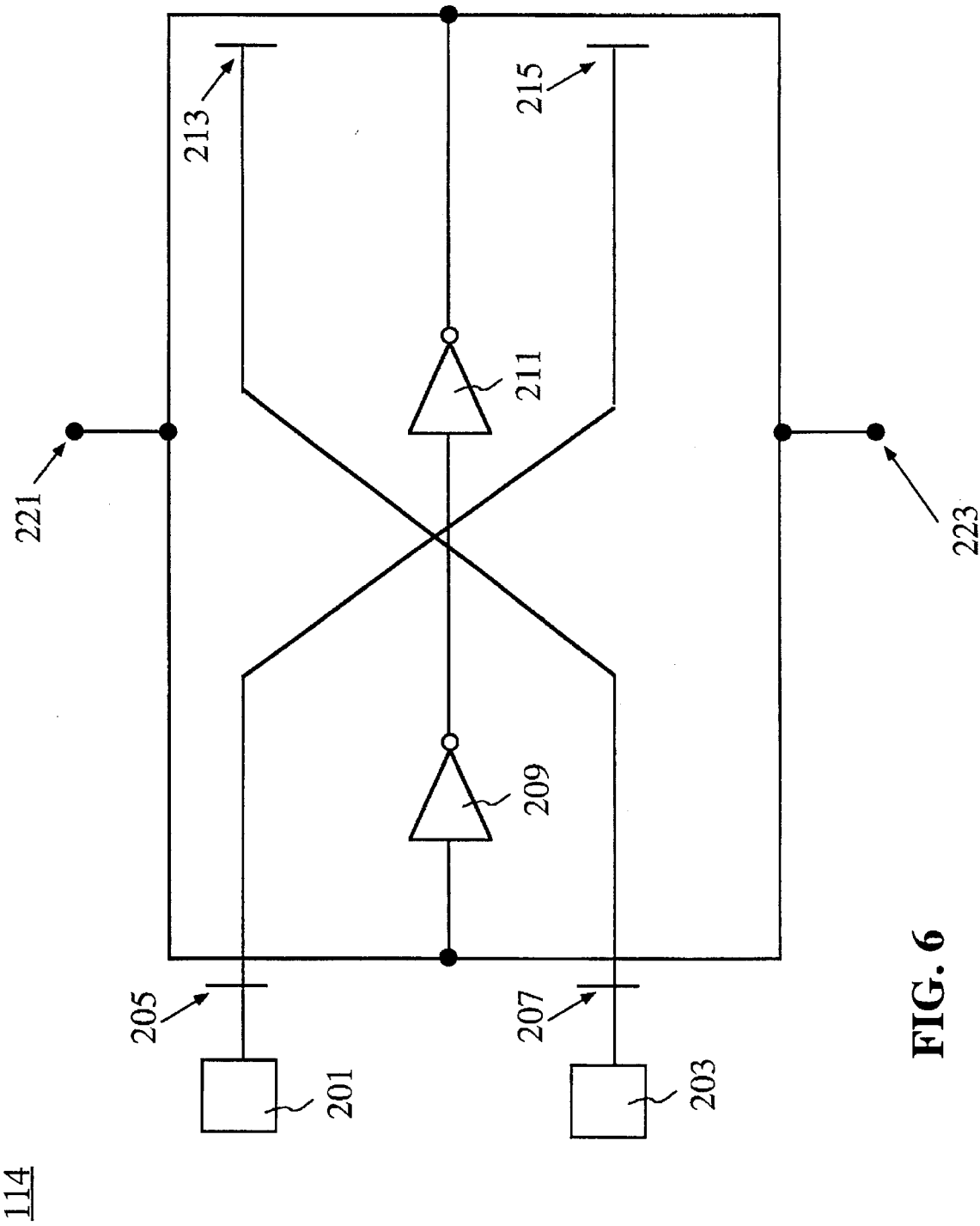
FIG. 6 is a schematic illustration of a programmable bi-directional buffer of the present invention periphery interconnect structure.

FIG. 6 illustrates an exemplary programmable bi-directional buffer 114 ("buffer 114") of the present invention. In the embodiment, a line of periphery interconnect structure 145 is coupled to node 221 and to node 223 as the input and output ports of buffer 114. To buffer a signal from node 221 to node 223, memory cell 201 is programmed with a "1" and memory cell 203 is programmed with a "0." In this manner, n-type pass transistors 205 and 215 are ON, whereas n-type pass transistors 207 and 213 are OFF. In this configuration, a signal originates from node 221, passes through transistor 205, through inverters 209 and 211, through transistor 215, and exits at node 223. To buffer a signal from node 223 to node 221, memory cells 201 and 203 are programmed with a "0" and a "1", respectively, thereby turning ON pass transistors 207 and 213 and turning OFF pass transistors 205 and 215. In this configuration, a signal originates from node 223, passes through transistor 207, through inverters 209 and 211, through transistor 213, and exits at node 221. To program bi-directional buffer 114 to function as an open circuit, both memory cells 201 and 203 are programmed with a "0." Bi-directional buffers are described in detail in U.S. Pat. Nos. 4,695,740 (issued on Sep. 22, 1987 to Carter), 4,713,557 (issued on Dec. 15, 1987 to Carter), and 4,835,418 (issued on May 30, 1989 to Hsieh), and are incorporated by reference herein.

FIGS. 7A, 7B, 7C and 7D illustrate corner segments 145c, 145f, 145h, and 145l, respectively, of the present invention. These corner segments solve two constraints. First, as described in reference to FIG. 3, in every n consecutive segments, each line of a group of n lines is buffered at least once. In accordance with the present invention, this requirement is maintained even in the corner segments. In order to satisfy this requirement, the present invention insures that upon rounding a corner, the least recently buffered signal line of a group is buffered by the next segment, and the most recently buffered signal line is shifted to a position of the group that will be buffered last. Second, because the uniformly constructed segments of the structure 145 are positioned in a uniform orientation with respect to the top and bottom edges and with respect to the left and right sides of the FPGA 100, the corner structures are not identical.

Although the signal lines of the segments of periphery interconnect structure 145 are bi-directional, for purposes of discussing FIGS. 7A, 7B, 7C, and 7D, a particular direction is adopted.

Figure 7A:
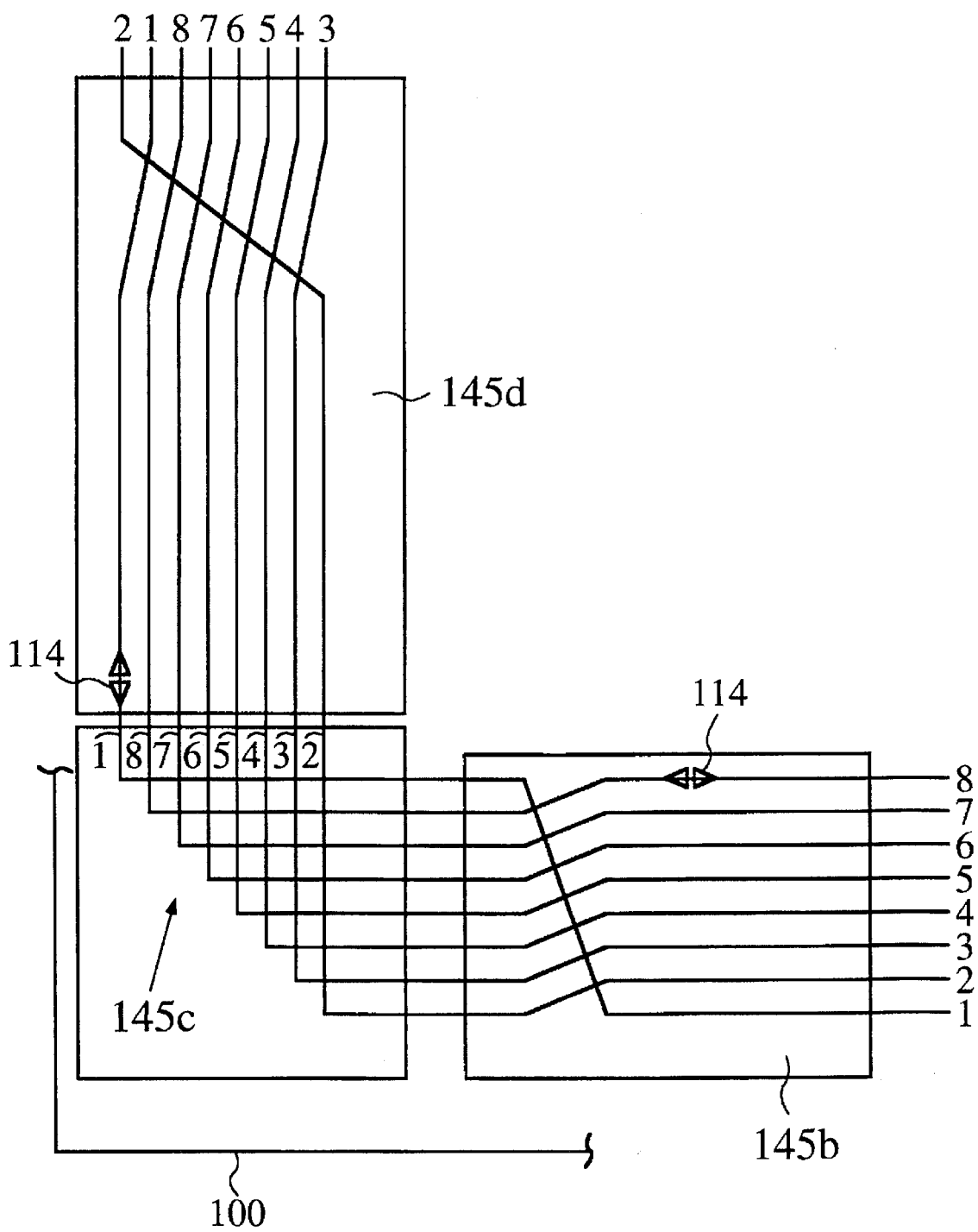
FIG. 7A is a schematic illustration of a portion of the periphery interconnect structure of FIG. 6 disposed in a first corner correlating to the lower left corner of FIG. 2.

FIG. 7A illustrates the bottom left corner segment 145c which couples edge segment 145d having a buffer 114 oriented at the outer edge of the segment and edge segment 145b having a buffer 114 oriented at the inner edge of the segment. With respect to edge segment 145b, in the bottom position at the left edge, line 1 is the least recently buffered line progressing right to left because buffer 114 is located at the top of segment 145b. As shown, line 1 enters at the bottom of segment 145b, is shifted up to the top, and exits segment 145b at the top. Corner segment 145c shifts line 1 to the left most position since buffer 114 is located in the left for the segments along the left edge of FPGA 100.

Lines 2–8 are individually shifted down (as they pass from right to left) by one line in edge segment 145b with line 8 being the most recently buffered and line 2 being the second least recently buffered line at the left edge of edge segment 145b. Corner segment 145c shifts these lines such that line 2 is placed at the right most position and line 8 is the second from the left most position entering segment 145d from the bottom. In this configuration, line 2 will be next to be buffered after segment 145d and line 8 will be buffered last.

Figure 7B:
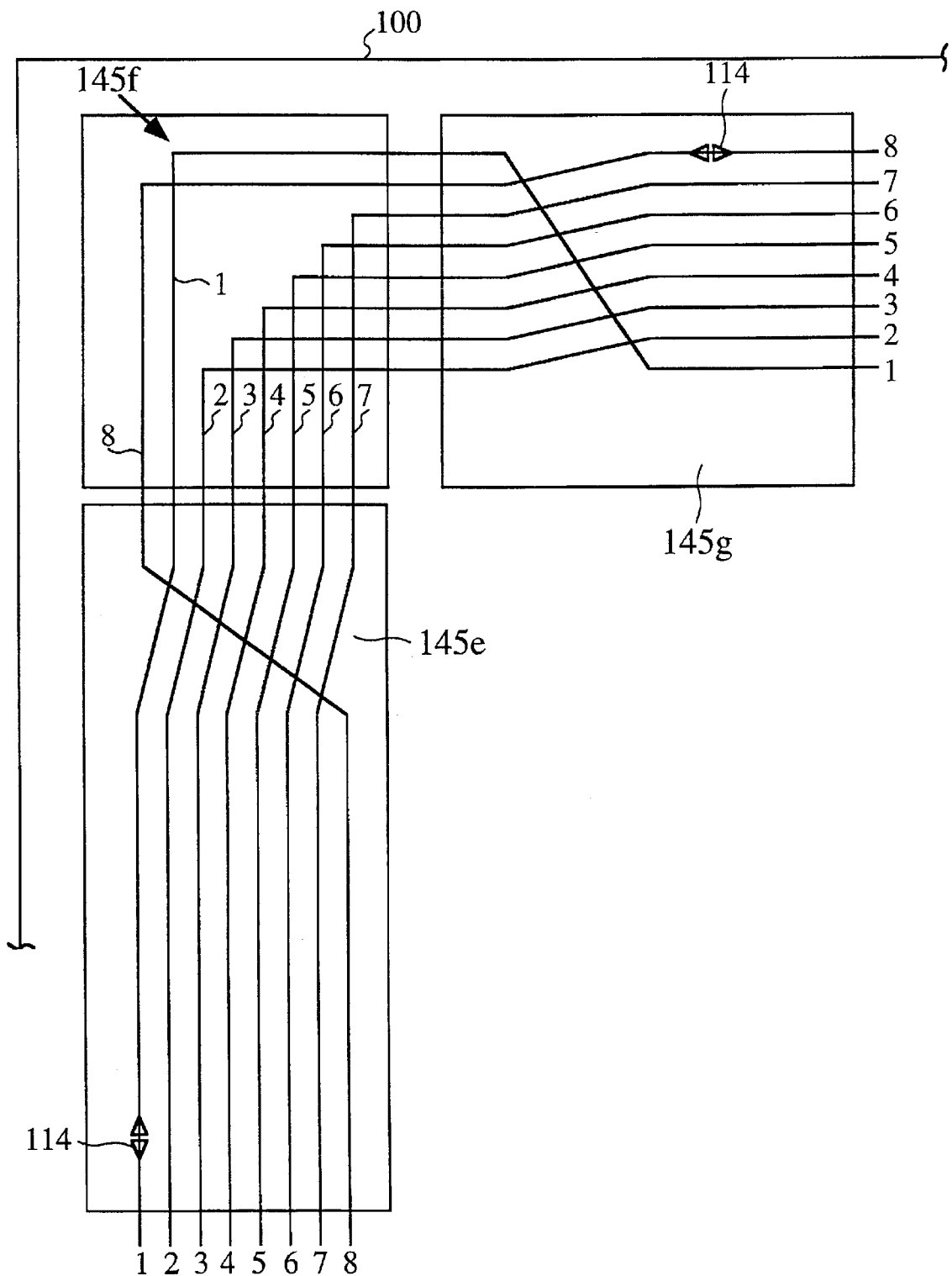
FIG. 7B is a schematic illustration of a portion of the periphery interconnect structure of FIG. 6 disposed in a second corner correlating to the upper left corner of FIG. 2.

FIG. 7B illustrates the top left corner segment 145f which couples edge segment 145e having a buffer 114 oriented at the outer edge of the segment and edge segment 145g having a buffer 114 also oriented at the outer edge of the segment. With respect to edge segment 145e, in the right position, line 8 is the least recently buffered line progressing from bottom to top because buffer 114 is located at the left of segment 145e. As shown, line 8 enters at the right of segment 145e, is shifted to the left and exits segment 145b at the left. In the orientation of segment 145g, the lines are shifted before they reach buffer 114. Therefore, line 8 is shifted by corner segment 145f such that it enters segment 145g in the second from the top position, and is then shifted to the top position and buffered by 114.

Line 1 of FIG. 7B is the most recently buffered signal line with respect to the top of segment 145e because it is in the left most position entering segment 145e from the bottom and is shifted one line to the right upon exiting segment 145e from the top. Since line 1 was the most recently buffered, corner segment 145f routes line 1 to the top of segment 145g because segment 145g will shift this line to the bottom, being the last line in the group to be buffered again.

Lines 2-7 of FIG. 7B, as entering the bottom of segment 145e, are individually shifted to the right by one line in segment 145e with line 2 being the second most recently buffered and line 7 being the second least recently buffered line. Corner segment 145f shifts these lines such that line 2 is placed at the bottom position entering segment 145g and line 7 is the third from the top most position entering segment 145g. In this configuration, line 7 will be next to be buffered after segment 145g and line 2 will be the last buffered.

Figure 7C:
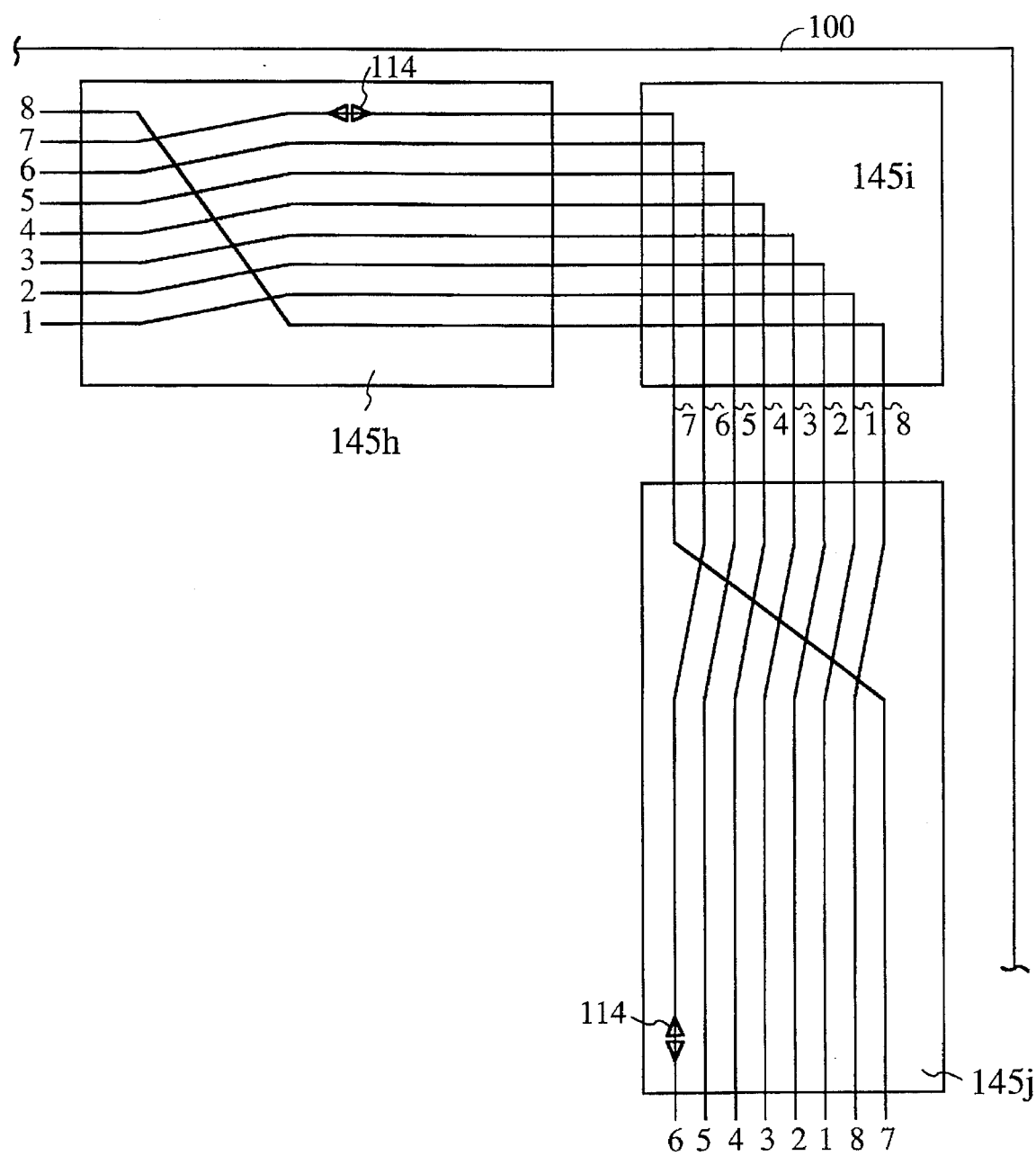
FIG. 7C is a schematic illustration of a portion of the periphery interconnect structure of FIG. 6 disposed in a third corner correlating to the upper right corner of FIG. 2.

FIG. 7C illustrates the top right corner segment 145i which couples edge segment 145h having a buffer 114 oriented at the outer edge of the segment and edge segment 145j having a buffer 114 oriented at the inner edge of the segment. With respect to segment 145h, exiting edge segment 145h from the right, line 7 is in the top position and is the most recently buffered line since the buffer 114 is located at the top of segment 145h. Line 6 is in the second to the top position and is the least recently buffered line. As shown, corner segment 145i shifts lines 7-1 so that they enter segment 145j in the left most position to the second to the right most position, respectively. Line 8 is shifted to the right most position by corner segment 145i.

Corner segment 145i shifts line 6 such that it enters segment 145j at the second from the left most position, is shifted to the left most position and buffered by buffer 114. Line 5 will be the next line of the group to be buffered. Line 7 enters segment 145j at the left most position, is shifted to the right most position and will be the last line of the group to be buffered, progressing from top to bottom.

Figure 7D:
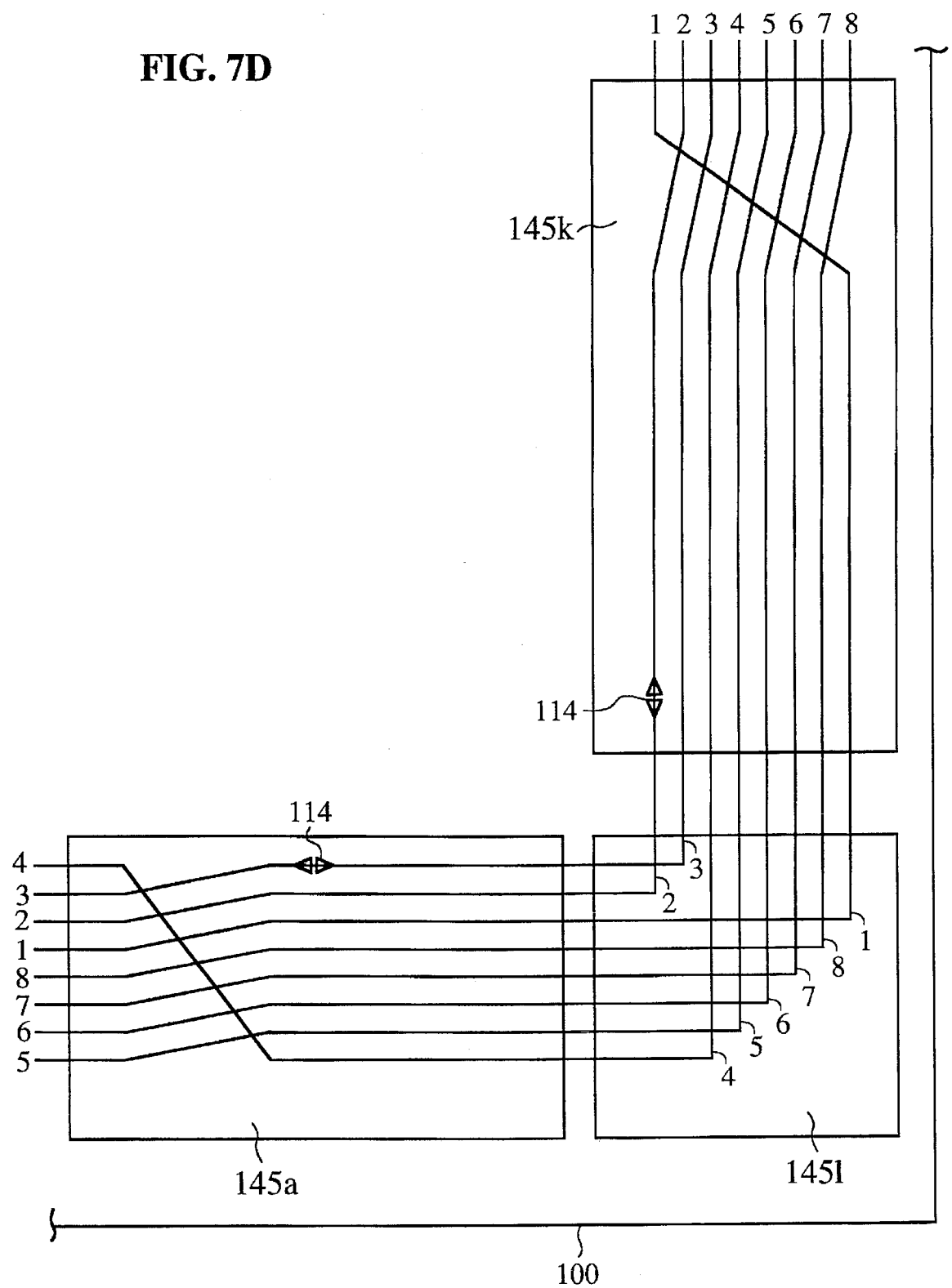
FIG. 7D is a schematic illustration of a portion of the periphery interconnect structure of FIG. 6 disposed in a fourth corner correlating to the lower right corner of FIG. 2.

FIG. 7D illustrates the bottom right corner segment 145i which couples edge segment 145k having a buffer 114 oriented at the inner edge of the segment and edge segment 145a having a buffer 114 also oriented at the inner edge. Lines 1-8 enter segment 145k from the top, line 2 exits the segment as the most recently buffered line, line 3 is the least recently buffered line, and line 4 is the next least recently buffered. Corner segment 145l switches the lines so that line 3 enters segment 145a from the right at the top most position, and line 2 is at the second from the top most position. Line 1 is the third from the top most position and lines 4-8 are arranged in order such that line 4 is the bottom position and line 8 is in the fourth from the top most position. Line 3 is then buffered by segment 145a and line 4 is shifted to the top by segment 145a and is buffered next. Line 2 will be the last line of the group to be buffered.

Note that the configuration of corner segments 145c, 145f, 145i, and 145l depends on (1) the orientation of buffers 114 with respect to the two edge segments located adjacent to the corner segment and (2) whether the signal lines pass through a shifting configuration, two shifting configurations, or no shifting configurations between buffers 114. For instance, with respect to FIG. 7B, the buffer configurations for edge segments 145e and 145g are outer and outer, respectively, and there are two shifting configurations between buffers 114. Table I below illustrates these two elements for each corner segment of the present invention.

TABLE I

| Corner | Edge Buffer Orientation | Shifting Configurations Between Buffers |
|---|---|---|
| Bottom-Left | Outer and Inner | One |
| Upper-Left | Outer and Outer | Two |
| Upper-Right | Outer and Inner | One |
| Bottom-Right | Inner and Inner | None |

As discussed above, the corner segments provide a configuration of the signal lines such that the least recently buffered signal line is oriented such that it will be the next buffered signal line after the corner is turned. This is true irrespective of the segment configurations as shown in Table I. Also, order is maintained by the present invention such that the most recently buffered signal line is situated such that it will be the last signal line of the group to be buffered. The present invention utilizes a uniform edge segment structure and orientation to provide the above advantageous result.

Figure 8:
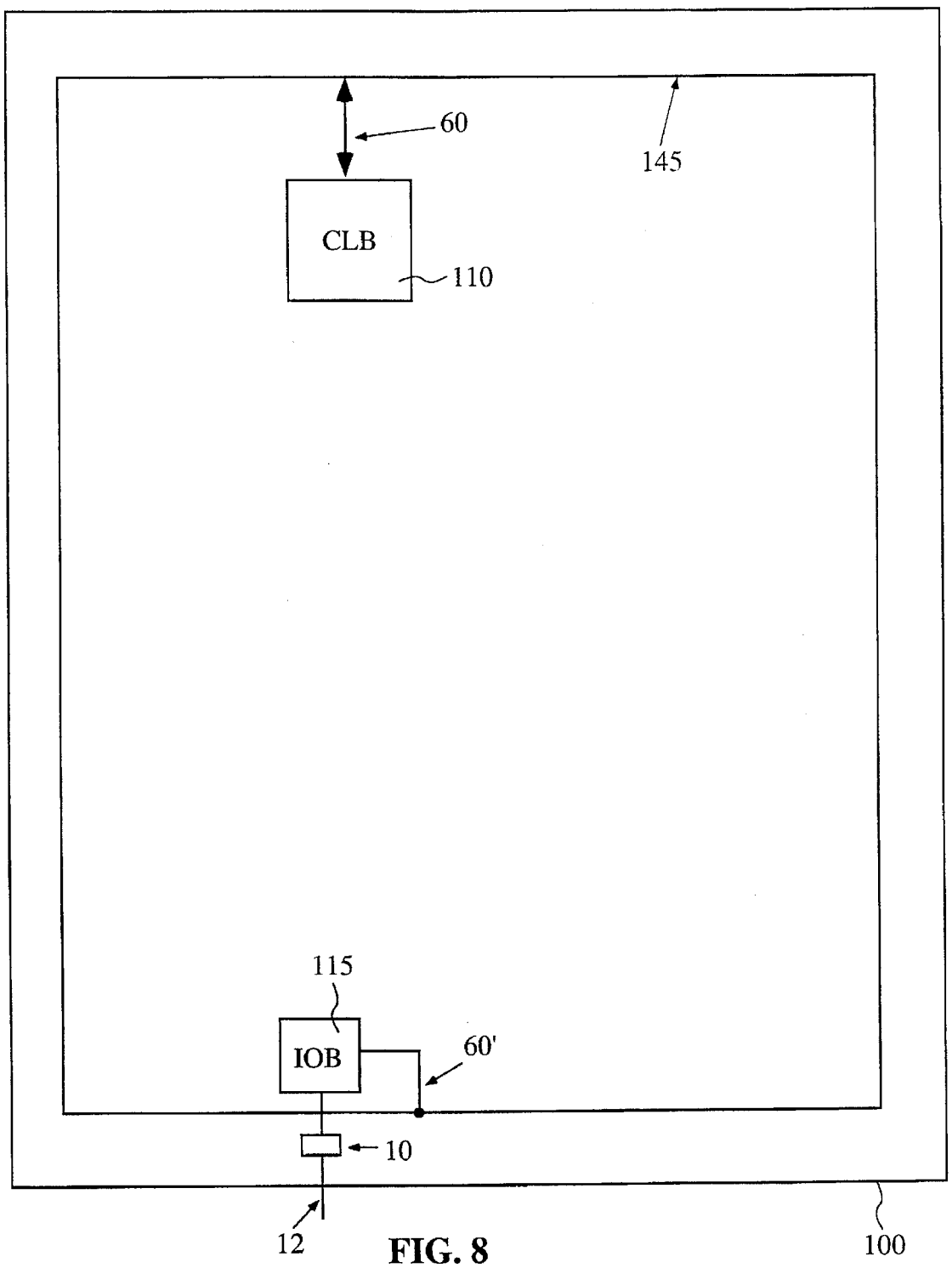
FIG. 8 is a logical diagram of a CLB to IOB connection over the local and periphery interconnect structure.

Using the present invention, designers can place specific logic at any place within FPGA 100 even though that logic must interface with a preassigned pin 12. FIG. 8 illustrates a logical diagram of a typical implementation. The interfacing CLB 110 couples with periphery interconnect structure 145 using a programmable local interconnect 60. A particular line (e.g., assume the line is called "x") of the periphery interconnect structure 145 is coupled to a particular line of local interconnect structure 60. Line x is then routed through the segments of peripheral interconnect structure 145 and at every 8 segments (in one embodiment) the signal is buffered. This is true even though the signal passes through the upper and lower left corners of FPGA 100. Buffer elements 114 along the signal line x are programmed to buffer the signal in the appropriate direction (e.g., depending on if the signal is a input signal to CLB 110 or an output signal from CLB). Line x is programmably coupled to a line of local interconnect 60' which is programmably coupled to interface with IOB 115. IOB 115 is then coupled to pad 10 which couples to preassigned external pin 12. The configuration of FIG. 8 is well suited for input signals onto pin 12 and into CLB 110 or for output signal from CLB 110 to pin 12.

Because periphery interconnect structure 145 is routed along the periphery of FPGA 100, structure 145 advantageously and dramatically reduces interference with other programmable interconnect structures of FPGA 100.

The preferred embodiment of the present invention, a periphery segmented ring interconnect structure for coupling between CLBs and IOBs having a uniform buffered segment such that n buffered stages buffer n interconnect lines, is thus described. While the present invention has been described in particular embodiments, it should be appreciated that the present invention should not be construed as limited by such embodiments, but rather construed according to the below claims.

What is claimed is:

1. In a programmable integrated circuit, an apparatus comprising:

an interconnect structure comprising a plurality of connected segments disposed along a periphery of said programmable integrated circuit wherein said plurality of connected segments form an annular geometry and provide a shifting configuration, wherein individual segments of said plurality of segments comprise n lines and are programmably coupled to an input/output circuit and to a configurable logic circuit.

2. An apparatus as described in claim 1 further comprising an external pin having a predetermined signal associated therewith, said input/output circuit coupled to said external pin, wherein said configurable logic circuit inputs or outputs said predetermined signal, and wherein said individual segments of said plurality of segments are coupled through a programmable interconnect structure to said input/output circuit and to said configurable logic circuit.

3. An apparatus as described in claim 1 wherein each segment of said plurality of connected segments further comprises a buffer coupled to a line of said n lines; and wherein each line of said n lines is buffered by said buffer at least once within n consecutive segments.

4. An apparatus as described in claim 3 wherein said buffer is a programmable bi-directional buffer.

5. An apparatus as described in claim 3 wherein said programmable integrated circuit is a field programmable gate array.

6. An apparatus as described in claim 3 wherein n=8.

7. In a programmable integrated circuit, an apparatus comprising:

an interconnect structure comprising a plurality of connected segments disposed along a periphery of said programmable integrated circuit wherein said plurality of connected segments form an annular geometry, wherein individual segments of said plurality of segments comprise n lines and are programmably coupled to an input/output circuit and to a configurable logic circuit, wherein each segment of said plurality of connected segments further comprises:

a buffer coupled to a line of said n lines; and a shifting configuration wherein each line of said n lines is buffered by said buffer at least once within n consecutive segments, wherein said interconnect structure further comprises corner structures disposed within corners of said programmable integrated circuit and wherein each of said corner structures couples said n lines between first and second adjacent segments such that the least recently buffered line with respect to said first adjacent segment is buffered by said second adjacent segment.

8. An apparatus as described in claim 7 wherein said n consecutive segments contains a corner structure between two segments.

9. A programmable integrated circuit comprising:

an interconnect structure comprising a plurality of connected segments disposed within a periphery of said programmable integrated circuit wherein said plurality of connected segments form an annular geometry;

wherein individual segments of said plurality of segments comprise n lines;

said plurality of connected segments allowing communication between a configurable logic circuit and a distant input/output circuit; and said interconnect structure further comprising corner structures disposed within corners of said programmable integrated circuit and wherein each of said corner structures couples said n lines between first and second adjacent segments such that the least recently buffered line with respect to said first adjacent segment is buffered by said second adjacent segment.

10. A programmable integrated circuit as described in claim 9 further comprising an external pin having a predetermined signal associated therewith, said input/output circuit is coupled to said external pin, wherein said configurable logic circuit inputs or outputs said predetermined signal, and wherein said individual segments of said plurality of segments are coupled through a programmable interconnect structure to said input/output circuit and to said configurable logic circuit.

11. A programmable integrated circuit as described in claim 9 wherein each segment of said plurality of connected segments further comprises:

a programmable bi-directional buffer coupled to a line of said n lines, said programmable bi-directional buffer programmable to be an open circuit; and a shifting configuration wherein each line of said n lines is buffered by said programmable bi-directional buffer at least once within n consecutive segments.

12. A programmable integrated circuit as described in claim 11 wherein said n consecutive segments contains a corner structure between two segments.

13. A programmable integrated circuit comprising:

(a) an interconnect structure comprising a plurality of connected segments disposed within a periphery of said programmable integrated circuit wherein said plurality of connected segments form an annular geometry;

(b) wherein individual segments of said plurality of segments comprise n lines, wherein each segment of said plurality of connected segments further comprises:

(i) a buffer coupled to a line of said n lines; and (ii) a shifting configuration wherein each line of said n lines is buffered by said buffer at least once within n consecutive segments; and (c) wherein said plurality of connected segments allow communication between a configurable logic circuit and a distant input/output circuit.

14. A programmable integrated circuit as described in claim 13 further comprising an external pin having a predetermined signal associated therewith, said input/output circuit is coupled to said external pin, wherein said configurable logic circuit inputs or outputs said predetermined signal, wherein said individual segments of said plurality of segments are programmably coupled through a local interconnect structure to said input/output circuit and to said configurable logic circuit.

15. A programmable integrated circuit as described in claim 13 wherein said buffer is a programmable bi-directional buffer.

16. A programmable integrated circuit as described in claim 13 wherein said programmable integrated circuit is a field programmable gate array.

17. A programmable integrated circuit comprising:

an interconnect structure comprising a plurality of connected segments disposed within a periphery of said programmable integrated circuit wherein said plurality of connected segments form an annular geometry, wherein individual segments of said plurality of segments comprise n lines, wherein each segment of said plurality of connected segments further comprises:

(i) a buffer coupled to a line of said n lines; and
(ii) a shifting configuration wherein each line of said n lines is buffered by said buffer at least once within n consecutive segments;

wherein said plurality of connected segments allow communication between a configurable logic circuit and a distant input/output circuit, wherein said interconnect structure further comprises corner structures disposed within corners of said programmable integrated circuit and wherein each of said corner structures couples said n lines between first and second adjacent segments such that the least recently buffered line with respect to said first adjacent segment is buffered by said second adjacent segment.

18. A programmable integrated circuit as described in claim 17 wherein said n consecutive segments contains a corner structure between two segments.

19. A programmable integrated circuit comprising:

(a) an interconnect structure comprising a plurality of connected segments disposed within a periphery of said programmable integrated circuit wherein said plurality of connected segments form an annular geometry;

(b) wherein individual segments of said plurality of segments comprise n lines and are programmably coupled through a local interconnect structure to a plurality of input/output circuits and to a plurality of configurable logic circuits, wherein individual segments of said plurality of connected segments further comprise:

(i) a programmable bi-directional buffer coupled to a line of said n lines; and
(ii) a shifting configuration wherein each line of said n lines is buffered by said programmable bi-directional buffer at least once within n consecutive segments; and (c) wherein said plurality of connected segments allows communication between a first configurable logic circuit of said plurality of configurable logic circuits and a distant first input/output circuit of said plurality of input/output circuits.

20. A programmable integrated circuit as described in claim 19 further comprising an external pin having a predetermined signal associated therewith, said first input/output circuit is coupled to said external pin and wherein said first configurable logic circuit inputs or outputs said predetermined signal.

21. A programmable integrated circuit comprising:

an interconnect structure comprising a plurality of connected segments disposed within a periphery of said programmable integrated circuit wherein said plurality of connected segments form an annular geometry, wherein individual segments of said plurality of segments comprise n lines and are programmably coupled through a local interconnect structure to a plurality of input/output circuits and to a plurality of configurable logic circuits, wherein individual segments of said plurality of connected segments further comprise:

(i) a programmable bi-directional buffer coupled to a line of said n lines; and
(ii) a shifting configuration wherein each line of said n lines is buffered by said programmable bi-directional buffer at least once within n consecutive segments, wherein said plurality of connected segments allows communication between a first configurable logic circuit of said plurality of configurable logic circuits and a distant first input/output circuit of said plurality of input/output circuits; and an external pin having a predetermined signal associated therewith, said first input/output circuit is coupled to said external pin and wherein said first configurable logic circuit inputs or outputs said predetermined signal, wherein said interconnect structure further comprises corner structures disposed within corners of said programmable integrated circuit and wherein each of said corner structures couples said n lines between first and second adjacent segments such that the least recently buffered line with respect to said first adjacent segment is buffered by said second adjacent segment.

\* \* \* \* \*